US011732349B2

(12) United States Patent
Shiripov et al.

(10) Patent No.: US 11,732,349 B2
(45) Date of Patent: Aug. 22, 2023

(54) IN-LINE COATER FOR VACUUM DEPOSITION OF THIN FILM COATINGS

(71) Applicant: OOO IZOVAK Tehnologii, Minsk (BY)

(72) Inventors: Vladimir J. Shiripov, Minsk (BY); Yaughen A. Khakhlou, Minsk (BY); Sergei P. Maryshev, Minsk (BY)

(73) Assignee: OOO IZOVAK TEHNOLOGII, Minsk (BY)

( * ) Notice: Subject to any disclaimer, the term of this patent is extended or adjusted under 35 U.S.C. 154(b) by 519 days.

(21) Appl. No.: 16/400,241

(22) Filed: May 1, 2019

(65) Prior Publication Data

US 2019/0338413 A1  Nov. 7, 2019

(30) Foreign Application Priority Data

May 4, 2018  (EA) .................................. 201800373

(51) Int. Cl.
*C23C 14/56* (2006.01)
*C23C 14/50* (2006.01)
(Continued)

(52) U.S. Cl.
CPC .......... *C23C 14/566* (2013.01); *C23C 14/505* (2013.01); *C23C 14/568* (2013.01); *C23C 16/4583* (2013.01); *C23C 16/4584* (2013.01); *C23C 16/4587* (2013.01); *C23C 16/4588* (2013.01); *C23C 16/54* (2013.01); *H01L 21/67173* (2013.01); *H01L 21/67706* (2013.01); *H01L 21/67709* (2013.01);
(Continued)

(58) Field of Classification Search
None
See application file for complete search history.

(56) References Cited

U.S. PATENT DOCUMENTS 4,681,773 A * 7/1987 Bean ..................... C23C 14/505
117/107
4,851,095 A   7/1989 Scobey et al.
(Continued)

FOREIGN PATENT DOCUMENTS

RU          78785 U1    12/2008
RU        2507308 C1     2/2014
(Continued)

*Primary Examiner* — Karla A Moore
(74) *Attorney, Agent, or Firm* — Patentbar International

(57) ABSTRACT

A transport system of the in-line coater moves the substrate holder from chamber to chamber in a direction perpendicular to the axis of its rotation and in each process chamber. The system moves the substrate holder to the working area along its axis of rotation. The process chamber has a cavity the size of which is determined by the dimensions of the substrate holder and is sufficient to place technology devices and monitoring instruments in it. In the first embodiment of the in-line coater, the supporting frame of the transport system on which the substrate holder is cantilevered, is configured to move from the chamber to the chamber both in horizontal and vertical positions. In the second embodiment of the in-line coater the supporting frame is configured to move only in a vertical position, and the in-line coater comprises additionally a substrate holder return chamber.

14 Claims, 5 Drawing Sheets

(51) Int. Cl.
| | |
|---|---|
| *H01L 21/677* | (2006.01) |
| *H01L 21/687* | (2006.01) |
| *C23C 16/54* | (2006.01) |
| *C23C 16/458* | (2006.01) |
| *H01L 21/67* | (2006.01) |

(52) U.S. Cl.
CPC .. *H01L 21/67712* (2013.01); *H01L 21/68764* (2013.01); *H01L 21/68771* (2013.01)

(56) References Cited

U.S. PATENT DOCUMENTS

| | | | | |
|---|---|---|---|---|
| 5,002,011 | A | * | 3/1991 | Ohmine .............. C23C 16/4588 118/715 |
| 5,474,611 | A | | 12/1995 | Murayama et al. |
| 5,993,614 | A | * | 11/1999 | Nomura ................ C23C 14/566 204/192.12 |
| 6,183,615 | B1 | * | 2/2001 | Yasar ................ H01L 21/67709 204/192.12 |
| 2011/0290175 | A1 | * | 12/2011 | Paranjpe ............. C23C 16/4582 117/85 |

FOREIGN PATENT DOCUMENTS

| | | |
|---|---|---|
| RU | 2586937 C1 | 6/2016 |
| WO | 2002/008484 A2 | 1/2002 |

\* cited by examiner

IN-LINE COATER FOR VACUUM DEPOSITION OF THIN FILM COATINGS

RELATED APPLICATIONS

This application claims priority to Eurasian Patent Application EA 201800373, filed May 4, 2018, which is incorporated herein by reference in its entirety.

FIELD OF THE INVENTION

The proposed engineering solutions (variants) relate to technological equipment for surface treatment in mass production, in particular, technological vacuum equipment for thin film deposition with specified optical, electrical and other characteristics.

BACKGROUND OF THE INVENTION

Various apparatus for thin film deposition onto surfaces of processed articles (substrates) are known in the art.

For example, U.S. Pat. No. 4,851,095, published Jul. 25, 1989, discloses an intermittent drum setup for coating substrates, comprising a substrate holder made as a cylinder with substrates mounted on a forming surface of the cylinder. Uniformity of the coating on the substrates is provided by drum rotation in a substrate processing area by means of linear-type service devices.

Also known in the art is an automated setup disclosed in RU patent No. 78785 for a utility model, published Dec. 10, 2008, in which for thin film deposition on substrates, the latter are placed on a supporting carriage, which is gradually moved along the setup.

However, all equipment known in the art, intended for deposition of thin-film coatings, have common serious disadvantages, namely: low quality of deposition of multilayer optical structures when used in mass production; the equipment being unsuitable for applying several layers simultaneously on both sides of the substrate; serious restrictions on use of processing devices with different operating modes.

All those disadvantages are due to the conceptual design limitations of the abovementioned equipment.

A mass production in-line coater for thin film deposition with specified optical, electrical and other characteristics disclosed in RU patent No. 2 507 308, published on Feb. 20, 2014, is considered the closest in terms of essential features to the claimed invention.

According to the above engineering solution, substrates are placed on rotatable cylindrical substrate holders, which are successively moved along working areas of an in-line coater with the same constant linear and rotation speed. In this case, the ratio of the linear and rotation speed of the substrate holder is chosen such that each point of the surface of the substrate holder makes at least two complete revolutions when passing through the working area.

The in-line coater comprises a lock and buffer chambers, at least one process chamber with a processing device, substrate holders, and a transport system. Each substrate holder is made in the form of a rotatable cylinder and is located on a carriage of a transport system mounted for successive movement of the chambers of the in-line coater with a constant linear speed.

However, this engineering solution also has disadvantages, namely: inability of simultaneous coating on both sides of the substrate; limited technologies and processing devices usable during thin film deposition onto the substrate in the in-line coater; unacceptable dimensions of the setup (due to the necessary number of process chambers) and cost of the in-line coater when trying to use it for depositing structures having tens and hundreds of layers.

SUMMARY OF THE INVENTION

An objective of proposed engineering solutions related to variants of an in-line coater for the deposition of thin film coatings in vacuum is to eliminate all the above disadvantages.

This objective is achieved by an in-line coater for vacuum deposition of thin film coatings according to a first variant of the current invention, comprising input and output load-lock chambers disposed at opposite ends of the in-line coater; at least one process chamber comprising processing devices for treating a substrate surface and for depositing thin-films on the substrate surface; monitoring devices; a pass-through transport system along the entire length of the in-line coater, with a carriage made as a supporting frame for successively moving a substrate holder from chamber to chamber; vacuum gates; a rotatable substrate holder with substrates mounted on a forming surface of the rotatable substrate holder; wherein the process chamber comprises a recess towards the atmosphere, the size of which is determined by dimensions of the substrate holder and is sufficient for placing processing and monitoring devices in it; wherein a rotary-motion feedthrough of the substrate holder disposed in the process chamber comprises a coupling device for coupling the feedthrough with a central shaft of the substrate holder, the coupling device being mounted on a rotation axis of the substrate holder and cantilevered on the supporting frame; wherein the substrate holder has an open face and a closed face, the open face being oriented towards a working area and having a circumscribed diameter corresponding to a maximum circumscribed diameter of the substrate holder; and wherein the transport system of the in-line coater is adapted to moving the substrate holder synchronously step-by-step from chamber to chamber in a direction perpendicular to the rotation axis of the substrate holder; and wherein the transport system is adapted to moving the substrate holder into the working area along the rotation axis in each of the process chambers, and in the in-line coater for vacuum deposition of the thin-film coatings according to a second variant of the current invention, comprising input and output load-lock chambers disposed at the same side of the in-line coater; at least two process chambers with processing devices for surface treatment of substrates and depositing thin films thereon; monitoring devices; a pass-through transport system along the entire length of the in-line coater, with a carriage made as a supporting frame and intended for successive movement of the substrate holder from chamber to chamber; a return chamber for altering a direction of movement of the substrate holder; vacuum gates; a rotatable substrate holder with substrates mounted on a forming surface of the rotatable substrate holder; wherein the process chamber comprises volume receess towards the atmosphere, the size of which is determined by dimensions of the substrate holder and is sufficient to place processing and monitoring devices in it; wherein a rotary-motion feedthrough of the substrate holder disposed in the process chamber comprises a coupling device for coupling the feedthrough with a central shaft of the substrate holder, the coupling device being mounted on a horizontal rotation axis of the substrate holder and cantilevered on the supporting frame, the supporting frame being configured to move in a vertical position, wherein the substrate holder has an open face and a closed face, and the open face being oriented towards a working area and having a circumscribed diameter corresponding to a maximum circumscribed diameter of the substrate holder; and wherein the transport system of the in-line coater is adapted to moving the substrate holder synchronously and step-by-step from chamber into chamber in a direction perpendicular to the rotation axis of the substrate holder; and in addition, wherein the transport system is adapted to moving the substrate holder into the working area along the rotation axis in each of process chambers.

In addition, in the first variant of the in-line coater for vacuum deposition of thin film coatings, the supporting frame of the transport system is configured to move from chamber to chamber either in a horizontal position, the rotation axis of the substrate holder being oriented vertically, or in a vertical position, the rotation axis of the substrate holder being oriented horizontally.

In both variants, the process chamber is divided into two areas, namely, a working area and a moving zone of the substrate holder wherein a diaphragm rigidly mounted on the supporting frame of the transport system separates the working area from the moving zone, wherein the substrate holder is made as a rotational surface, for example, a dome, a truncated cone or a cylinder.

Moreover, the surface of the substrate holder may comprise devices for independent rotation of substrates and through-holes for mounting substrates.

In addition, the working area of the process chamber may have elements providing gas isolation of processing devices, wherein the surface of the substrate holder may have fixing devices for the substrates, wherein the substrates may be designed as removable elements.

In both variants of the in-line coater, the processing devices may comprise evaporators and/or magnetrons and/or ion sources and/or plasma generators, wherein the monitoring devices may comprise optical transmission/reflection control devices and/or quartz coating rate meters.

In addition, the second variant of the in-line coater, the substrate holder is made as a cylinder with through-holes on the forming surface, wherein substrates are installed in the through-holes; and wherein the working area comprises at least two processing devices for simultaneous two-sided film deposition on the surfaces of the substrates.

BRIEF DESCRIPTION OF THE DRAWINGS

FIG. 1 shows schematically a first variant of the claimed in-line coater;

FIG. 2 shows schematically a second variant of the claimed in-line coater;

FIG. 3 shows an embodiment of a process chamber;

FIG. 4 shows an embodiment of a process chamber;

FIG. 5 illustrates mounting a substrate holder in a process chamber;

FIG. 6 illustrates mounting devices on a substrate holder for rotating substrates;

FIG. 7 illustrates placement of components in a process chamber.

DETAILED DESCRIPTION OF THE PREFERRED EMBODIMENTS

The presented in-line coater for vacuum deposition of thin film coatings (variants) includes:
1. input load lock chambers,
2. output load lock chambers,
3. process chamber,
4. processing devices,
5. pumping units,
6. substrates,
7. through-holes for mounting substrates,
8. substrate holder,
9. fixture,
10. vacuum gate,
11. transport system,
12. rollers,
13. linear motion guide,
14. magnetic bearing,
15. supporting frame,
16. working area,
17. recess in the process chamber,
18. separating partition,
19. diaphragm,
20. rotary motion feedthrough,
21. central shaft,
22. coupling device,
23. device for rotating substrates,
24. loading table,
25. unloading table,
26. return chamber,
27. return module,
28. moving zone,
29. plasma generator,
30. magnetron,
31. evaporator.

Figure 3:
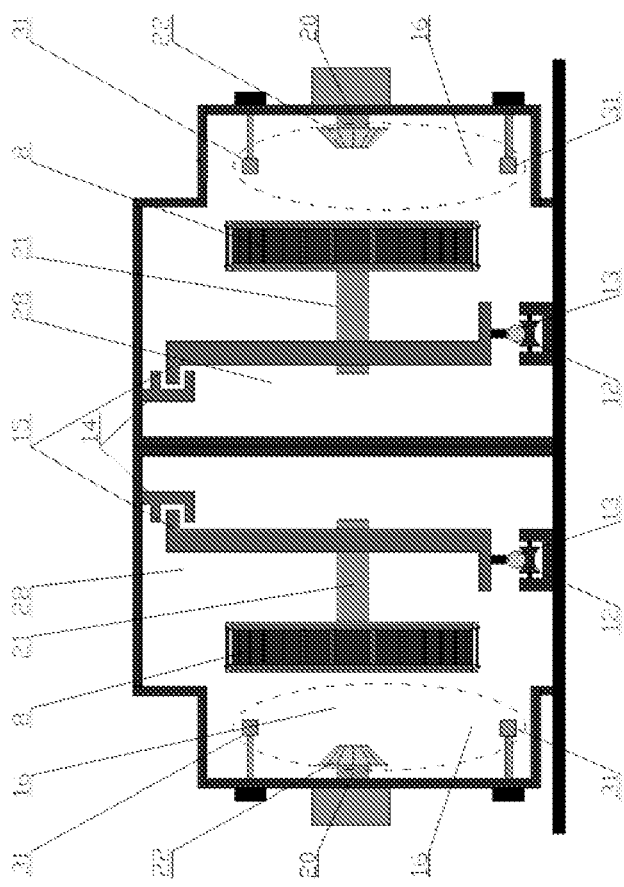

In order to ensure the operation of the in-line coater according to the first variant (FIG. 1), all the chambers: input load lock chambers 1, output load lock chambers 2, a required number of process chambers 3, are connected in series to form the in-line coater, where necessary, through vacuum gates 10, and equipped with a single pass-through transport system 11, pumping units 5, and processing devices 4 for treating a surface of substrate 6 and depositing thin films thereon, and monitoring devices are placed in each process chamber 3. Moreover, each process chamber 3 includes a rotary motion feedthrough 20 with a coupling device 22 (FIG. 3).

The chambers of the in-line coater form a vacuum passageway where pass-through transport system 11 is arranged that ensures moving of substrates 6 fixed on forming surface of substrate holder 8 from one process chamber 3 to another one for coating deposition.

As a rule, the number of process chambers 3 in the line coater is determined by a thickness and composition of a material being deposited onto substrates 6.

Figure 4:
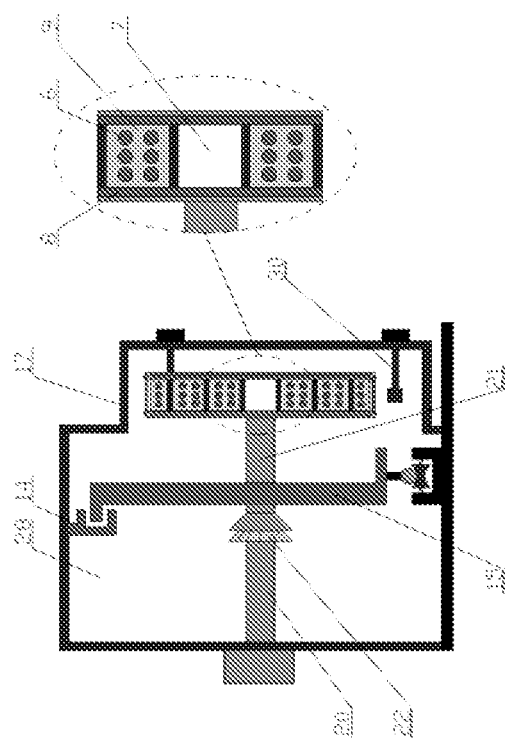

Using the loading table 24 outside the vacuum passageway, substrates 6 are placed for deposition of thin films on a forming surface of the substrate holder 8, made for example with through-holes 7, wherein the substrates are fixed, for example, using substrate fixtures (FIG. 4). And on the unloading table 25, already finished products—substrates 6, with thin films deposited on them, are removed from substrate holder 8 and placed in a transport cassette for further intended use.

Devices 9 for fixing substrates 6 on the forming surface of substrate holder 8 are made as removable elements, whereas the shape of holes 7 intended for mounting substrates 6 may correspond to the shape of the substrates placed therein.

Substrate holder 8 may be made as a rotational surface, for example a dome, a truncated cone or a cylinder and comprises an open face and a closed face, wherein the closed face of substrate holder 8 is mounted on central shaft 21 of substrate holder 8 and on the rotation axis of substrate holder 8. Moreover, devices 23 may be mounted on the forming surface of substrate holder 8 providing additional independent rotation of substrates 6 (FIG. 3, 4, 5, 6).

Central shaft 21 on the side of the closed face of substrate holder 8 is cantilevered to the carriage made as supporting frame 15 of transport system 11 which includes linear motion guide 13 mounted on rollers 12 of transport system 11. The upper part of supporting frame 15 may be a magnetic linear motion guide for moving through a non-contact magnetic support made as magnetic bearing 14 that allows substrate holder 8 to be held in a vertical position (FIG. 3).

Transport system 11 allows for moving substrate holder 8 into recess 17 made in process chamber 3 towards the atmosphere, wherein rotary motion feedthrough 20 of substrate holder 8 provided with device 22 for coupling rotary motion feedthrough 20 with central shaft 21 of substrate holder 8 is also positioned in recess 17.

Recess 17 made in process chamber 3 has a size corresponding to the size of substrate holder 8 and is sufficient to place processing devices 4 and monitoring devices (not shown in the figures). Monitoring devices used herein are optical transmittance/reflection control devices and/or quartz coating rate meters.

Processing devices 4 and test and measurement devices placed in the recess 17 form in the process chamber 3 a working area 16 for treating substrates 6 which is separated from a part of the process chamber where transport system 11 is located, forming a moving zone 28 (FIG. 3, 4, 6).

Figure 6:
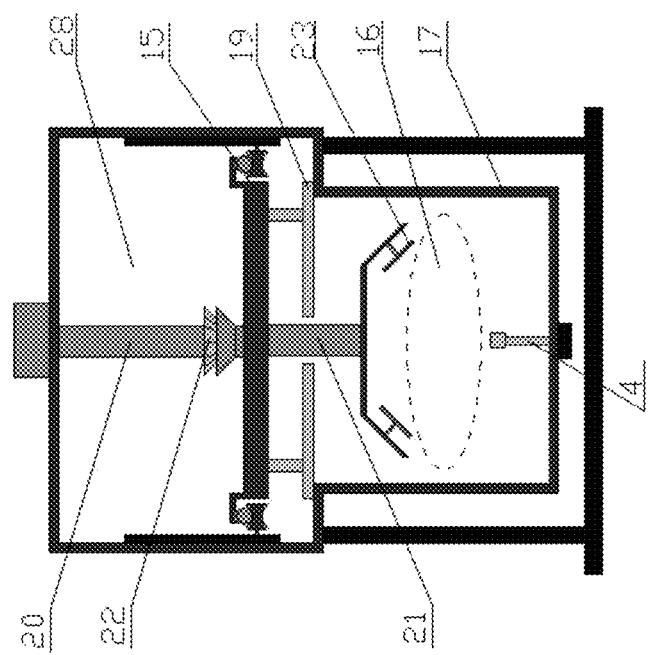
Figure 5:
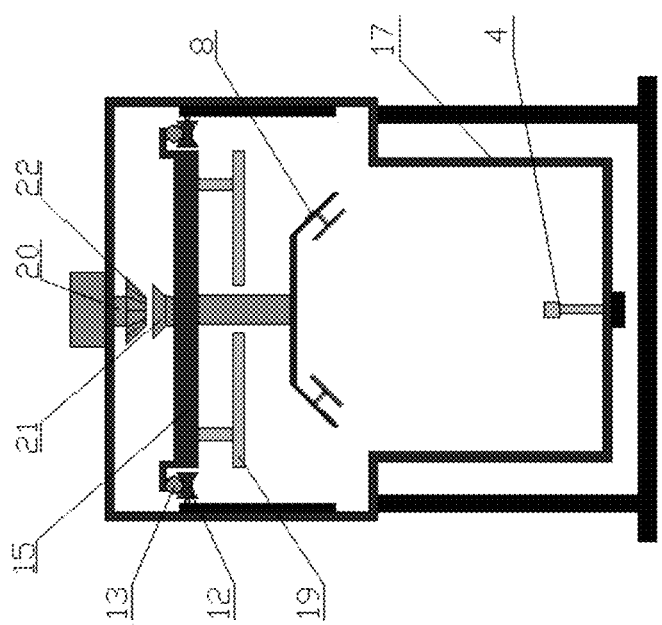

Separation of process chamber 3 into working area 16 and moving zone 28 is provided by diaphragm 19 rigidly mounted on supporting frame 15 (FIGS. 5, 6). Such a division of process chamber 3 is necessary to protect the surface of substrate 6 from undesirable contamination when depositing thin films on its surface. It should be noted that the open face of substrate holder 8 is always directed towards working area 16, wherein the circumscribed diameter of the open face corresponds to the maximum circumscribed diameter of substrate holder 8.

Transport system 11 of the in-line coater is configured for synchronous and step-by-step movement of substrate holder 8 from the chamber into the chamber in a direction perpendicular to the axis of its rotation, and in addition, in each process chamber 3 transport system 11 provides for moving substrate holder 8 from moving zone 28 to working area 16 along the axis of rotation of substrate holder 8.

According to the first variant of the claimed in-line coater, supporting frame 15 of transport system 11 may be mounted with the ability to move from chamber to chamber, both in a horizontal and vertical position. Thus, the rotation axis of substrate holder 8 is oriented, respectively, vertically or horizontally.

Evaporators 31 and/or magnetrons 30 and/or ion sources and/or plasma generators 29 and/or heating devices, etc., located in working area 16 exterior to the open face of substrate holder 8 may be used as processing devices 4 of the in-line coater.

Moreover, in the first variant of the in-line coater, when a rotational surface, for example, in the form of a dome (a hemisphere) or a truncated cone, is used as substrate holder 8, devices 23 providing independent rotation of substrates 6 may be mounted on the forming surface of substrate holder 8 (FIG. 5, 6). Moreover, devices 23 for independent rotation of substrates 6 may also be provided with fixtures 9. Such a design solution of substrate holder 8 makes it possible to deposit high-quality coating on the substrates and ensure high uniformity of the coating.

When using evaporators 31 with indirect heating of the crucible and with a renewable amount of the material for film deposition as processing devices 4 (FIG. 3), the number of processing devices 4 installed in working area 16 is determined by the dimensions of substrate holder 8.

Heating devices are generally located in working area 16 inside substrate holder 8, wherein monitoring devices with several units may be installed both on the inner side and on the outer side of substrate holder 8.

Figure 7:
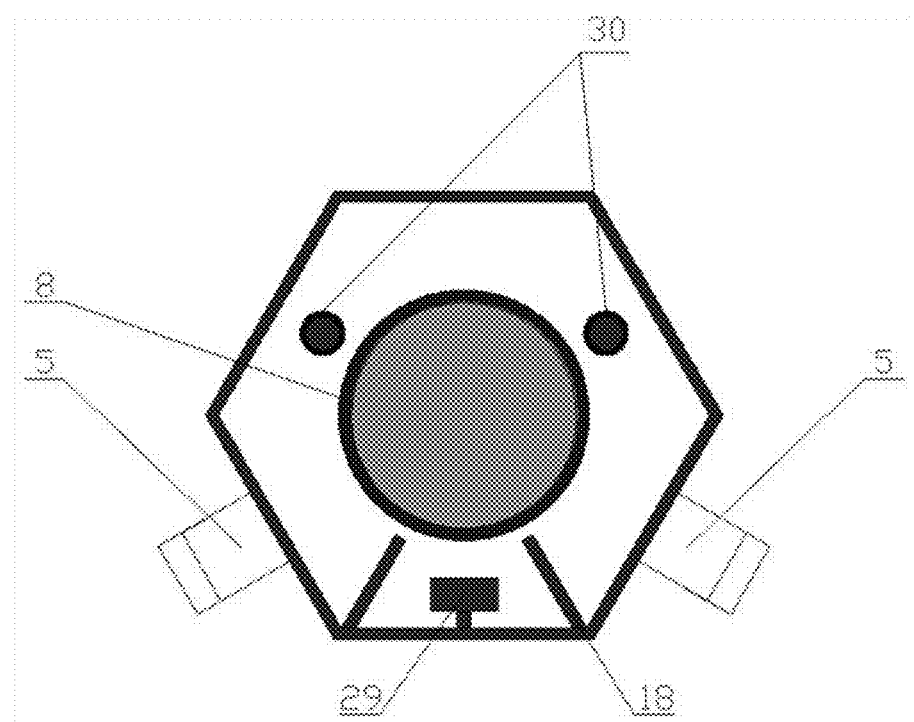

It is possible to use different processing devices 4 in working area 16, the use of which requires maximum isolation from each other. In this case, various elements are used, providing, for example, gas isolation of processing devices. For gas insulation, pumping units 5 are placed between the processing devices on the walls of recess 17, wherein processing devices 4 are further separated by structural elements, for example, separating partitions 18 (FIG. 7).

Thus, the use of various processing devices in one process chamber 3 provides for process variability and low defectiveness of the deposited coating.

The second design variant of the in-line coater (FIG. 2) differs from the first one in that it allows, if it is necessary in accordance with the chosen technological process, to use a larger number of process chambers that are set up such that they form two tracks in the in-line coater: —a direct and return track, conjunct by return chamber 26. The use of return chamber 26 allows input and output load lock chambers 1 and 2, respectively, to be located on one side of the in-line coater, which reduces the use of the production area by arranging only one clean zone A (FIG. 2) and rationally divides the production site into a clean zone and service area of the in-line coater.

The clean zone A is a part of the production room in which concentration of aerosol particles is controlled and which is constructed and used so as to minimize penetration, generation, and accumulation of particles within the room and in which other parameters such as temperature, humidity and pressure are monitored.

Figure 2:
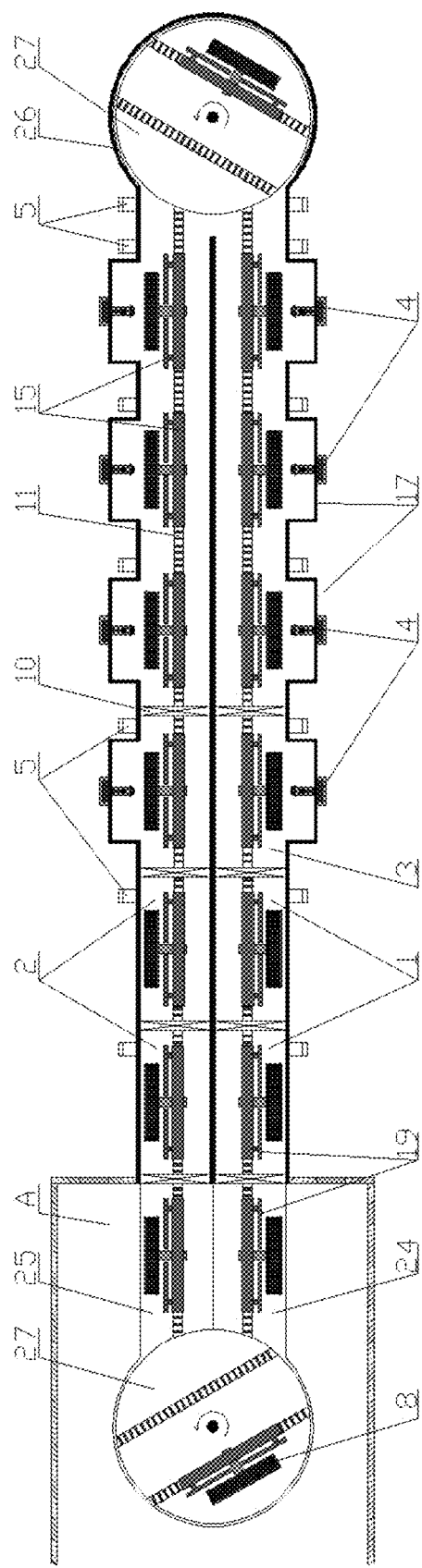

Vacuum return chamber 26 is located at the end of the in-line coater opposite the clean zone A and is equipped with return module 27 (FIG. 2). In the clean zone A, at the end of the return track, there is a return module 27 (FIG. 2) intended for redirecting substrate holder 8 from the return track to the other one, the direct track.

Supporting frame 15, in the second variant of the in-line coater, is mounted such as to move in a vertical position, the axis of rotation of substrate holder 8 being always horizontal.

It should be noted that in the second variant of the in-line coater, substrate holder 8 is made as a substrate holder, the rotational surface of which is in the form of a cylinder, with one closed face on the side of supporting frame 15 and a second open face, wherein the closed face may be blind or in the form of metal plates or spokes, and wherein processing devices 4, for example, magnetrons 30 and evaporators 31 (FIG. 3, 4), may be placed inside and outside of substrate holder 8. and Provided that substrates 6 are fixed in through-holes 7 of cylindrical substrate holder 8, processing devices 4 are arranged, as a rule, such that the coating on substrates 6 can be deposited simultaneously from both sides, external and internal. To this end, at least two processing devices 4 are used, one of which is located outside the forming surface of substrate holder 8 and the other—inside the forming surface (FIG. 3, 4).

According to the first variant, the proposed in-line coater for vacuum deposition of thin film coatings operates as follows.

At the input of the in-line coater, as a rule, there are usually two loading chambers 1, and two unloading chambers 2 at the output of the coater, wherein process chambers 3 with processing devices 4 and monitoring devices therein (not shown in the figures) are placed along the entire length of tin-line coater 3 between input and output load lock chambers. Moreover, the number of process chambers 3 in the in-line coater depends on the specified technological process and the required output of the in-line coater.

Substrates 6 are placed on the forming surface of substrate holder 8, which is cantilevered to supporting frame 15 from the closed face side, in holes 7 using fixtures 9 or in devices 23 for rotating substrates.

Supporting frame 15, which is part of transport system 11 equipped with linear motion guides 13 mounted on rollers 12, together with substrate holder 8, is fed to loading table 24.

From loading table 24, substrate holder 8 filled with substrates 6 passes through vacuum gate 10 located at the input end of the in-line coater and enters first input load lock chamber 1 at atmospheric pressure therein. In this case, the vacuum gates between first and second input load lock chambers 1 and between the load lock and process chamber are closed. In first load lock chamber 1, pumping units 5 create a preliminary low vacuum, which is necessary for preparation for the technological process.

At the end of the pumping in first input load lock chamber 1, vacuum gate 10 between input load lock chambers 1 is opened and supporting frame 15 with substrate holder 8 is moved to a second input load lock chamber 1 in which pumping units 5 create a high vacuum. During pumping, vacuum gate 10 is closed between the input load lock chambers 1, the next supporting frame 15 with substrate holder 8 and substrates 6 is located in the first input load lock chamber 1 and the first input load lock chamber 1 is pumped to obtain low vacuum.

Figure 1:
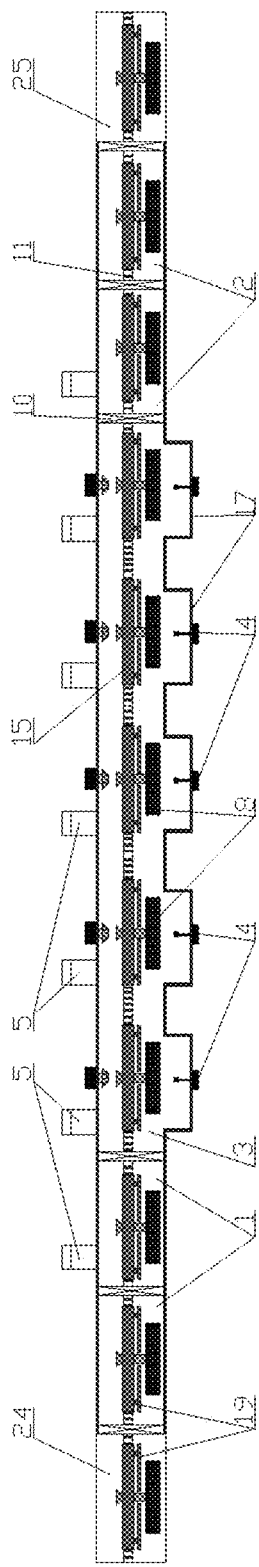
FIGS. 1, 2, 3, 4, 5, 6, 7 are explanatory drawings that illustrate schematically two variants of an in-line coater (FIG. 1, 2) and components comprised in the two variants of the claimed in-line coater for vacuum deposition of thin-film coatings, and explain operation of proposed variants of the in-line coater for vacuum deposition of thin film coatings, namely.

Below, to simplify the description, we do not repeat that each subsequent supporting frame 15 with substrate holder 8 fed into the in-line coater, is in the previous chamber (FIG. 1, 2).

Pre-treatment devices for the substrates, for example, cleaning or heating devices are placed sometimes in input load lock chamber 1 that is second in the course of the technological process.

Under this condition, second input load lock chamber 1 combines the locking function with the pre-treatment of substrates 6 and, in fact, it is the first process chamber 3.

Then the vacuum gate between the second input load lock chamber 1 and process chamber 3 is opened, and supporting frame 15 with substrate holder 8 is moved into process chamber 3. Vacuum gate 10 between the input load lock chamber 1 and the process chamber 3 is closed. Using a part of transport system 11 located in process chamber 3, supporting frame 15 with substrate holder 8 is moved from moving zone 28 to working area 16 located in recess 17 provided in process chamber 3. Therewith, diaphragm 19 rigidly connected to supporting frame 15 is adjacent to the wall of the process chamber and separates working area 16 from moving zone 28. Rotary motion feedthrough 20 connected to central shaft 21 of substrate holder 8 using coupling device 22.

In process chamber 3 a high vacuum is pre-create and constantly maintained by pumping units 5. A motor of rotary motion feedthrough 20 is turned on, which, through connection to central shaft 21, rotates substrate holder 8 with substrates 6, and power is supplied to processing devices 4 installed in working area 16.

In case of simultaneous use of plasma generator 29 and magnetrons 30 as processing devices 4 for film deposition in one process chamber 3, gas isolation is provided of the processing devices from each other using pumping units 5 and separating partitions 18 (FIG. 7).

When the desired thickness and composition of the coating are achieved, the power of process devices 4 is turned off and the rotation of substrate holder 8 is stopped on command from monitoring devices.

Supporting frame 15 with substrate holder 8 is displaced from recess 17 to the starting position in moving zone 28 using transport system 11 and the central shaft 21 of substrate holder 8 is uncoupled from rotary motion feedthrough 20.

After the process of film deposition on substrates 6 is completed in process chamber 3, vacuum gate 10 between process chamber 3 and output load lock chamber 2 is opened and supporting frame 15 with substrate holder 8 moves through the vacuum passageway to output load lock chamber 2, where a high vacuum is pre-created, whereupon vacuum gate 10 between the process chamber and output load lock chamber 2 is closed.

Further, through vacuum gate 10 between output load lock chambers 2 supporting frame 15 is moved to the second load lock chamber 2 and the vacuum gate between output load lock chambers 2 is closed. At the same time, one output load lock chamber 2 is pumped out, restoring a high vacuum level in it, and air is allowed to enter another output load lock chamber 2 located at the output of the in-line coater to achieve atmospheric pressure in it.

Supporting frame 15 with substrate holder 8 is moved to unloading table 25 through vacuum gate 10 at the output of the in-line coater and vacuum gate 10 is closed.

Substrates 6 with thin films deposited thereon are removed from substrate holder 8, placed on a transport cassette (not shown in the figures), and transported to a storage area.

If several process chambers are used in the in-line coater, materials of different compositions requiring use of various gases may be applied in each of the process chambers.

Diaphragms 19 mounted on supporting frames 15 of transport system 11 and dividing process chambers 3 into two zones, working area 16 and moving zone 28, of substrate holder 8, help to avoid mixing of different working atmospheres between process chambers 3.

Moreover, moving zones 28 of all process chambers form the so-called transport passageway of the in-line coater in which through transport system 11 is located. And the task of eliminating mutual influence of different working atmospheres in separate process chambers is solved automatically since no working gases are specifically supplied to the vacuum passageway, and powerful pumping units 5 are installed in the vacuum passageway, which maintain a pressure that is inevitably lower than the pressure in working areas 16.

This process proceeds continuously and a very important point in its implementation is that when substrate carriers 8 are continuously moved from one chamber to another, transport system 11 of the in-line coater allows that movement of substrate holders 8 synchronously and stepwise in a direction perpendicular to the rotation axis of substrate holder 8, and simultaneously, provides the possibility of their movement to the working area along the rotation axis of the substrate holders.

In addition, in the embodiment according to the first design variant, in the operation of the in-line coater, supporting frame 15 of transport system 11, if necessary, may move from chamber to chamber in a horizontal position with the rotation axis of substrate holder 8 being oriented vertically, or in a vertical position with the rotation axis of substrate holder 8 being oriented horizontally.

As noted above, the in-line coater may comprise several process chambers 3, for example, for deposition of complex coatings from various materials or for deposition of a thin film of large thickness. The longest coating time in any process chamber 3 of the vacuum in-line coater is selected as a time step of the in-line coater.

The process of coating for the claimed in-line coater includes several successive steps of the same duration. The duration of the step is equal to the duration of the time step.

The in-line coater has a maximum capacity, i.e. it is operated with the minimum time step, in a case when deposition of the entire thin film coating is planned taking into account the rate of forming materials having different compositions and calculated thicknesses of different layers.

Operation of the embodiment according to the second variant of the in-line coater differs from the operation of the first variant in that only a cylindrical substrate holder 8 is used as substrate holder 8. On loading table 24, located immediately before the input load lock chambers 1, substrates 6 are fixed in through-holes 7 of cylindrical substrate holder 8 by fixtures 9. In the second variant of the in-line coater, supporting frames 15 are oriented vertically, and transport system 11 includes magnetic bearing 14.

In addition, according to the second variant, the in-line coater comprises two tracks of the transport system, a direct track and return tract. Moreover, the input and output load lock chambers 1 and 2 are located on one side of the in-line coater, and on the opposite side, vacuum return chamber 26 is placed including return module 27 for moving supporting frame 15 with substrate holder 8 from the direct track to the return track.

The movement of supporting frame 15 by transport system 11 from loading table 24 through input load lock chambers 1 and process chamber 3 located on the direct track is carried out in a manner similar to the first variant of the in-line coater synchronously and stepwise in a direction perpendicular to the rotation axis of substrate 8. As in the first variant, transport system 11 provides in process chamber 3 a possibility of moving substrate holder 8 from moving zone 28 to working area 16 along the rotation axis of substrate holder 8.

Upon completion of film deposition on substrates 6 in process chamber 3 of the direct track, supporting frame 15 together with substrate holder 8 enters return chamber 26 where return module 27 moves supporting frame 15 with substrate holder 8 from the direct track to the return track and positions them on the return track of transport system 11. Thereafter, supporting frame 15 together with substrate holder 8 is moved to process chamber 3 located on the return track for further processing of substrates 6, and return module 27 of return chamber 26 returns to its initial position.

Upon completion of the treatment of substrates 6 in process chamber 3 on the return track, move supporting frame 15 together with substrate holder 8 is moved via transport system 11 through open vacuum gate 10 to first output load lock chamber 2 and at the next step is moved to the second one, the last output load lock chamber 2. At the last step of the in-line coater operation, when depositing a thin film of a predetermined structure, supporting frame 15 together with substrate holder 8 is moved to unloading table 25 and the vacuum gate at the output is closed.

I. An example of an embodiment of the in-line coater according to the first variant (FIG. 1).

The proposed in-line coater according to the first variant is intended for deposition of a multilayer thin-film optical structure on a surface of glass substrates, namely for mass production of cut-off and bandpass filters for optics of photo and video cameras of modern smartphones.

A typical structure of one of a near-infrared filter comprises 37 layers with a total thickness of about 2242 nm. As layer materials, a combination of following compounds is used: $Si_3N_4$-silicon nitride, as a layer with a high refractive index, $SiO_2$-silicon dioxide, as a layer with a low refractive index, Si-silicon, as a layer with high absorption and high refractive index in the visible region.

There are 4 layers of silicon nitride with a total thickness of about 147 nm, 17 layers of silica with a total thickness of about 777 nm and 16 layers of silicon with a total thickness of about 1318 nm of the total of 37 layers in the structure of the optical thin film coating.

As an example of a specific embodiment of the in-line coater, an in-line coater is regarded in which the following is used: loading table 24, first and second input load lock chambers 1, first and second output load lock chambers 2, unloading table 25, five process chambers 3 not separated by vacuum gates 10, cylindrical substrate holder 8, substrates 6 in the form of optical glass workpieces installed in through-holes 7 of substrate holder 8 using fixtures 9 (FIG. 1, 4).

As processing devices 4, magnetrons 30 with silicon cathodes, gas discharge plasma generators 29, substrate heaters (not shown in the figures), monitoring devices in the form of optical control devices (not shown in the figures) are used.

Through transport system 11 includes supporting frames 15 with linear motion guides 13 mounted on guide rollers 12 and magnetic bearings 14.

At the time when substrate holder 8 is in recess 17 of process chamber 3, magnetrons 30 and the plasma generators 29 in working area 16 are arranged to affect the outer surface of substrate holder 8.

The heaters (not shown in the figures) of substrates 6 are located on the inner side of substrate holder 8, and monitoring devices with their different units are located both on the outer and inner side of substrate holder 8. That said, plasma generator 29 is separated from magnetrons 30 by separating partitions 18 and turbomolecular pumps 5 (FIG. 7).

During the technological process, argon with a pressure of about $(8-9)\times 10^{-1}$ Pa is supplied to the zone of magnetrons 30 as the working gas, and to the zone of the gas discharge plasma generator 29, when the ICP device (Inductively Coupled Plasma), oxygen or nitrogen is supplied at a slightly lower pressure—$(5-7)\times 10^{-1}$ Pa.

Thus, conditions are achieved in which practically pure argon acts as a working gas in the zone of magnetrons, thereby ensuring a high rate of sputtering of silicon and a minimum of arc formation induced by oxide films on the sputtering target surface of magnetron 30. The latter provides a very low defectiveness of the layers due to absence of micro particles created by arcs.

Substrates 6 with a single pass through the magnetron zone take onto their surface a layer of pure silicon with a thickness of a fraction of a nanometer. When the substrates pass through the gas-discharge zone of plasma generator 29, that layer is converted respectively into silicon dioxide, if oxygen is fed to plasma generator zone 29, or to silicon nitride, if nitrogen is fed. When a plasma of argon is supplied to generator zone 29, an energy effect is exerted on the layer of deposited silicon without changing its chemical composition.

Thus, by switching the working gases supplied to the zone of plasma generator 29 in a specific process chamber 3, at a particular time a layer is formed with a composition corresponding to one of the materials of the final thin film filter structure.

Since the total thickness of the thin film structure is 2242 nm, the thickness of individual layers in this structure varies from 8 nm to 200 nm, and the rates of application of different materials, in this case, are approximately equal, the use of five process chambers 3, in each of which packets of thin film layers of approximately equal thickness are deposited on a substrate with the same speed, is optimal.

For the optical structure under consideration, such a partitioning leads to the following situation: in first process chamber 3, the first 12 layers with a total thickness of 447 nm will be applied, in the second process chamber 3 the next 5 layers with a total thickness of 461 nm will be applied, in the third—3 layers with a thickness of 419 nm, in the fourth—9 layers with a thickness of 466 nm, in the fifth—the last 8 layers with a thickness of 449 nm will be applied.

The film deposition on substrates 6 mounted on substrate holder 8 in the described in-line coater consists of the following successive steps of the same duration.

Step 1

Supporting frame 15 of transport system 11 is fed to loading table 24 located in front of input load lock chambers 1. Substrate fixtures 9 with substrates 6 fixed therein are installed in through-holes 7 arranged on the forming surface of substrate holder 8. Air is introduced into first input load lock chamber 1 up to the atmosphere pressure. In this case, vacuum gate 10 between first and second load lock chambers 1 is closed.

Step 2

The lock of first load lock chamber 1 is opened from loading table 24 side and supporting frame 15 with substrate holder 8 and substrates 6 installed on its forming surface is moved the to first input load lock chamber 1. Vacuum gate 10 is closed and air volume of first input load lock chamber 1 is evacuated to obtain the pre-vacuum using a mechanical pump 5. At this time, loading table 24 contains the next supporting frame 15 with substrate holder 8 to install substrates 6.

Step 3

Vacuum gate 10 between the first and second input load lock chambers 1 is opened and supporting frame 15 with substrate holder 8 is moved to input load lock chamber 1. At this time, vacuum gate 10 between the second input load lock chamber 1 and the first downstream process chamber 3 is closed. The lock between the first and second input load lock chambers 1 is closed, after which the air is evacuated from the second input load lock chamber 1 to obtain a high vacuum.

Step 4

Vacuum gate 10 between the second input load lock chamber 1 and the first process chamber 3 is opened. Supporting frame 15 with substrate holder 8 and substrates 6 placed thereon enters the first downstream process chamber 3. After this, vacuum gate 10 between the second input load lock chamber 1 and the first process chamber 3 is closed. Transport system 11 of process chamber 3 displaces supporting frame 15 with substrate holder 8 into recess 17, wherein diaphragm 19 mounted on supporting frame 15 separates working area 16 from moving zone 28 in process chamber 3. Rotary motion feedthrough 20 is connected to central shaft 21 of substrate holder 8 by means of coupling device 22 and substrate holder 8 rotates at a frequency of 1-3 revolutions per second.

Simultaneously, required gases are supplied to the working area 16. At the same time, working gases are supplied to the zone of location of plasma generator 29, and argon is supplied to the zone of magnetrons 30 location, wherein necessary working pressure in working area 16 is set and substrates 6 are heated the to the temperature determined by the technological process by turning on the heating devices and controlling the temperature. Power is supplied to magnetrons 30 and plasma generator 29 and the first layer of the thin film is deposited.

When the desired thickness of the deposited layer is achieved, the power of magnetrons 30 and plasma generator 29 is turned off at a command of the monitoring device and the feeding system is switched to change the composition of the working gases in the area of plasma generator 29. After that, the power of magnetrons 30 and plasma generator 29 is turned on again and the second film layer is deposited. This sequence of operations is repeated until the twelfth layer of the planned film structure is deposited and the total thickness of the pack of layers on substrates 6 reaches 447 nm. After that, the power of processing devices is turned off, and the valves for supplying working gases are closed. Transport system 11 in process chamber 3 moves supporting frame 15 to substrate holder 8 from working area 16 located in recess 17 to the moving zone 28 where central shaft 21 of substrate holder 8 is uncouple from rotary motion feedthrough 20.

Step 5, 6, 7, 8

Supporting frame 15 with substrate holder 8 is moved sequentially along the in-line coater from one process chamber 3 to the next one by means of transport system 11, carrying out the same processes at each step as at step 4.

The difference is that five layers with a total thickness of 461 nm are deposited on substrates 6 in the second process chamber 3, in the next process chamber three layers with a total thickness of 419 nm, in the fourth process chamber 3 nine layers are deposited with a total thickness of 466 nm, and in the last, fifth chamber in the course of the process, the last eight layers are deposited with a total pack thickness of 449 nm.

Step 9

Vacuum gate 10 between the last process chamber 3 and input load lock chamber 2 is opened, supporting frame 15 with substrate holder 8 from process chamber 3 is moved to the first output load lock chamber 2 and vacuum gate 10 is closed.

Step 10

Vacuum gate 10 between output load lock chamber 2 is opened and supporting frame 15, together with substrate holder 8 is move to the next output load lock chamber 2, the vacuum gate between the load lock chambers is closed. Pumping to a high vacuum is carried out in the output load lock chamber 2 adjacent to process chamber 3, and air is allowed to pass to the other output load lock chamber 2 to obtain atmospheric pressure.

Step 11

Vacuum gate 10 between output load lock chamber 2 and unloading table 25 is opened, supporting frame 15 with substrate holder 8 is moved to unloading table 25, and vacuum gate 10 at the output of the in-line coater is closed. After this, the last air discharge chamber 2 is pumped out to a preliminary vacuum by means of a mechanical pump.

Step 12

Substrates 6 with the deposited thin films of 37 layers are removed from substrate holder 8, placed in the transport cassette and delivered to the storage area for further intended use, wherein supporting frame 15 with substrate holder 8 is returned to loading table 24, where through-holes 7 of substrate holder 8 are filled in again with substrates 6.

II. An example of an embodiment of the in-line coater according to the second variant (FIG. 2, 3).

The second design variant of the claimed in-line coater can be used in mass production of heterojunction solar cells to form an optical window and copper metallization of a surface of single-crystal silicon wafers.

Due to the fact that in the technology of manufacturing heterojunction solar cells there is a rigid restriction on the maximum allowable processing temperatures (not higher than 200° C.), it is impossible to use widely available methods of silk-screen printing and burning high-temperature silver-containing pastes to create metal contacts on the front and back surfaces of a silicon wafer. Therefore, enterprises that assemble solar panels from solar cells using soldering technology can not use heterojunction solar cells, despite the fact that their efficiency and potential are significantly higher than those of other types of silicon solar cells having metallization based on soldered high-temperature silver-containing pastes.

The known structure of a solar cell includes a silicon wafer with two thin layers of amorphous silicon deposited on both sides of the wafer using vacuum PECVD (PECVD-Plasma Enhanced Chemical Vapor Deposition) deposition methods. The thickness of each layer does not exceed 10-20 nm. Then, on both sides of the silicon wafer, layers of a transparent conductive oxide are deposited over the amorphous layer by PVD (PVD-Plasma Vapor Deposition) methods, usually ITO (Indium tin oxide). As a specific technological method, magnetron sputtering from targets of the appropriate composition is most often used. The next step in the technology of manufacturing a solar cell is silk-screen printing, which is carried out using expensive low-temperature silver-containing pastes.

Solar cells obtained by the described technology, cannot be used by most manufacturers of solar panels in view of the impossibility to solder the printed contacts. Special expensive equipment and materials should be used in order to avoid the use of the soldering operation when assembling solar cells.

An alternative way of manufacturing solar cells may be the use of the proposed in-line coater in which layers of copper with a thickness of about 5 μm are applied to the ITO surface without interrupting the vacuum cycle, wherein these layers are protected by a dense thin tin film.

A mask is printed on the surface of structures obtained by the above process using silkscreen methods, whereupon the copper-tin metal coating is etched in places unprotected by a printed mask. After that, the mask material is removed from the surface. This process is quite cheap and widely distributed in the production of printed circuit boards. The resulting solar cells now have copper plating, which is much cheaper than silver-containing one. In addition, tin on the surface of copper not only protects its surface, which will be used for soldering but also serves as a tinning analog for the soldering process.

The second variant of the in-line coater, shown in FIG. 2, can be used for PVD deposition by the ITO structure (~100 nm)+Cu (~5000 nm)+Sn (~700 nm). Such in-line coater comprises eight process chambers 3 arranged in pairs on the direct and return tracks of transport system 11. In the first and the last process chambers 3 in working area 16, magnetrons 30 are used as processing devices 4. In the first process chamber, magnetrons 30 with cathodes from ITO material, and in the last process chamber—with tin cathodes. In the other process chambers 3, evaporators 31 are installed as processing devices 4, the design of which ensures a constant replenishment of the consumable copper material. Processing chambers 3 with evaporators 31 are not connected to each other via vacuum gates 10.

Magnetrons 30 and evaporators 31 in working area 16 are arranged in such a way as to act simultaneously on the outer and inner surfaces of cylindrical substrate holder 8. To this end, at least two processing devices 4 are placed in working area 16 exteriorly to the open face of substrate holder 8. Moreover, one processing device 4 is placed exteriorly to the outside of the forming surface of substrate holder 8 and the second one is located interior its inner side (FIG. 3).

A mixture of argon and oxygen is supplied to the zone of location of magnetrons 30 installed in first process chamber 3 to a pressure of about $(8-9) \times 10^{-1}$ Pa, and argon is fed to the zone of magnetrons 30 in the last process chamber 3 to the same pressure. The working gases are not supplied to the other process chambers, and the evaporation of copper occurs in a high vacuum at a residual gas pressure of $5 \times 10^{-3}$ Pa. Thus, conditions are attained in which the electrical conductivity of copper is maximally close to the conductivity of a bulk material.

Substrates 6, namely the silicon plates located on the cylindrical surface of substrate holder 8 in through-holes 7 are treated with magnetrons 30 or evaporators 31 at the same time from both the outer and the inner side. In this case, layers of deposited material—ITO, Cu, Sn, are applied wherein the thickness of the layers is determined by the speed of sputtering (evaporation) maintained at this process chamber 3 and the speed of rotation of cylindrical substrate holder 8. Each layer of material of finite thickness deposited on substrate 6 consists of a large number of sublayers applied in one revolution of substrate holder 8. This allows forming a film on the surfaces of substrate 6 with a minimum number of through-holes (punctures).

In order to minimize the working time of the complete cycle of the in-line coater, the final thickness of the copper layer—5000 nm is best to be divided into six equal parts, for which six process chambers 3 are used, respectively. In this case, each part will have a thickness of approx. 835 nm and the cycle time of the line will be equal to the largest of the three times required for applying, respectively, either 100 nm of ITO, or 835 nm of copper, or 700 nm of tin.

The process of film deposition on substrates 6 in the in-line coater according to the second design variant consists of sixteen consecutive steps of the same duration. In this case, the durations of all steps are equal and constitute the cycle time of the in-line coater.

Step 1

Silicon wafers 6 are fixed in the through holes of cylindrical substrate holder 8 using fixtures 9, after supporting frame 15 oriented vertically of transport system 11 is fed to loading table 24 located immediately upstream of the first input load lock chamber 1. Air is supplied to the first input load lock chamber 1 to the atmosphere pressure, wherein vacuum gate 10 between the input load lock chambers is left closed.

Step 2

Vacuum gate 10 between loading table 24 and the first input load lock chamber 1 is opened and supporting frame 15 with substrate holder 8 is moved to the first input load lock chamber 1. Thereafter, vacuum gate 10 on the side of loading table 24 is closed and the volume of the first input load lock chamber 1 is pumped out using mechanical pump 5 to achieve the pre-vacuum. At this time, loading table 24 already has the next supporting frame 15 with substrates 6 fixed in substrate holder 8.

Step 3

Vacuum gate 10 between the first and second input load lock chambers 1 is opened and supporting frame 15 together with substrate holder 8 and with substrates 6 mounted on its forming surface is moved to the next (second) input load lock chamber 1. The vacuum gate between airlock chambers 1 is closed. In the second input load lock chamber 1, a high vacuum is created wherein air is introduced into the previous input load lock chamber 1. In this step vacuum gate 10 between the input load lock and the first upstream process chamber 3 is kept closed.

Step 4

Vacuum gate 10 positioned between the second input load lock chamber 1 and the first process chamber 3 is opened. At that, Vacuum gate 10 between the first and second process chambers 3 is kept closed. Supporting frame 15 with substrate holder 8 is moved to the first process chamber 3 and vacuum gate 10 is closed.

Transport system 11 located inside process chamber 3 displaces supporting frame 15 with substrate holder 8 into recess 17 of process chamber 3. At that, rotary motion feedthrough 20 is connected, through coupling device 22, to central shaft 21 of substrate holder 8. Substrate holder 8 is rotated at a frequency 1-3 revolutions per second, then argon and oxygen is supplied in the required proportion to working area 16 in which magnetrons 30 are installed.

In process chamber 3, desired operating pressure is set, then power is supplied to magnetrons 30 and an ITO layer of 100 nm is deposited to both sides of the silicon wafers.

At the end of the film deposition on the substrate, which is controlled by the monitoring devices, the power of magnetrons 30 is switch off and the valves of the working gas supply system for supplying gas to the first process chamber 3 are closed, wherein said chamber is pumped out to a high vacuum.

Using transport system 11 in first process chamber 3, supporting frame 15 is displaced from working area 16 of recess 17 to movement zone 28 where central shaft 21 of substrate holder 8 is uncoupled the from rotary motion feedthrough 20.

Step 5

Vacuum gate 10 between the first and second process chambers 3 is opened, supporting frame 15 with substrate holder 8 is moved to the second process chamber 3 and vacuum gate 10 closed. Transport system 11 located in the second process chamber 3 displaces supporting frame 15 with substrate holder 8 into recess 17. Substrate holder 8 is rotated at a frequency of 1-3 turns per second by using rotary motion feedthrough 20, after it is connected to central shaft 21, through coupling device 22, then power is supplied to evaporators 31 and the next film layer is deposited, namely a copper layer with thickness of 835 nm simultaneously on both sides of the ITO coated substrates 6. Power of the evaporators 31 is then switched off at a signal of the monitoring devices controlling the process of coating substrates 6 and a regular dose of copper is fed to the crucible of evaporator 31. Supporting frame 15 is displaced the from recess 17 to moving zone 28 using transport system 11 and central shaft 21 of substrate holder 8 is uncoupled from rotary motion feedthrough 20.

Step 6, 7

At these steps, supporting frame 15 is moved to the following process chambers, where operations similar to the fifth step are repeated.

Step 8

Supporting frame 15 is moved the to return chamber 26. Return module 27 located in vacuum return chamber 26, which is a movable part of the transport system, rotates supporting frame 15 with substrate holder 8 by 180 degrees and positions it on the return track of transport system 11. Unfolded supporting frame 15 with substrate holder 8 moves to next process chamber 3, after which return module 27 returns to the initial position.

Step 9

In the fifth process chamber 3, all operations are analogous to step 5.

Step 10, 11

Supporting frame 15 with substrate holder 8 is moved to the following upstream process chambers 3, where all operations similar to those of step 5 are repeated in the same way.

Step 12

Vacuum gate 10 between the seventh and eighth process chambers 3 is opened. Supporting frame 15 with substrate holder 8 is moved to the eighth process chamber, vacuum gate 10 between the last process chamber 3 and output load lock chamber 2 is closed. After supporting frame 15 with substrate holder 8 is housed in the last process chamber 3, vacuum gate 10 between the process chambers 3 is closed. Using transport system 11 located in the eighth process chamber 3, supporting frame 15 with substrate holder 8 is moved to recess 17, rotary motion feedthrough 20 is connected to central shaft 21 of substrate holder 8 using coupling device 22 and substrate holder 8 is rotated at a frequency of 1-3 rotations per second. Argon is supplied into working area 16 to the required pressure, power to magnetrons 30 supplied and a 700 nm thick layer of tin is deposited to the copper layer already deposited on both sides of the silicon wafers. After that, the power of magnetrons 30 is switched off and the valves of the argon supply system are closed, and process chamber 3 is pumped out to achieve a high vacuum.

Step 13

Vacuum gate 10 located between the last process chamber 3 and output load lock chamber 2 is opened. Supporting frame 15 with substrate holder 8 is moved to output load lock chamber 2, vacuum gate 10 between process chamber 3 and load lock chamber 2 is closed.

Step 14

The lock between output load lock chambers 2 is opened and supporting frame 15 is moved to the last output load lock chamber 2, the lock between output load lock chambers 2 is closed. In the last vacuum chamber of the in-line coater, which is output load lock chamber 2, air is introduced to achieve atmospheric pressure, wherein the second output load lock chamber 2 is pumped out to achieve a high vacuum.

Step 15

Vacuum gate 10 between output load lock chamber 2 and unloading table 25 is opened, supporting frame 15 with substrate holder 8 is moved to unloading table 25, then vacuum gate 10 is closed and the last downstream output load lock chamber 2 is pump out to achieve the preliminary vacuum using mechanical pumping unit 5.

Step 16

The finished products, i.e. silicon plates with thin-film ITO-Cu—Sn deposited on both sides are removed from substrate holder 8 and supporting frame 15 with substrate holder 8 is returned to loading table 24 by return module 27.

Thus, the proposed variants of in-line coaters designed for vacuum deposition of thin films on substrates make it possible to increase the productivity of equipment used for mass deposition of high-quality thin films with a large number of layers and to provide simultaneous deposition of films on both sides of the substrates. This not only increases the overall system performance but excludes deformation (for example, bending) of the substrate during the formation of the coating with the thickness of several microns in sequence on each side thereof.

In the case of a coating of several tens or hundreds of layers, the proposed technical solutions make it possible to reduce the number of process chambers used, which means that they offer more compact in-line coaters that do not require the use of huge production areas for their installation.

The proposed technical solutions have been tested in pilot production and showed good results.

REFERENCES

1. U.S. Pat. No. 4,851,095, published Jul. 25, 1989, IPC C23C14/00.
2. RU utility model patent No. 78785, published Dec. 10, 2008, IPC B28B 3/00.
3. RU patent No. 2 507 308, published Feb. 20, 2014, IPC C23C 16/54; C23C 14/56.

What is claimed is:

1. An in-line coater for vacuum deposition of thin film coatings comprising:
    an input load lock chamber and an output load lock chamber disposed at opposite ends of the in-line coater;
    at least one process chamber comprising processing devices for treating a substrate surface and for depositing thin films on the substrate surface, monitoring devices;
    a pass-through transport system along a length of the in-line coater, with a carriage made as a supporting frame for successively moving a rotatable substrate holder from the input load lock chamber to the output load lock chamber, the rotatable substrate holder having a forming surface with substrates mounted on the forming surface; vacuum gates; and
    a rotary-motion feedthrough of the substrate holder disposed in the process chamber and comprising a coupling device for coupling the feedthrough with a central shaft of the substrate holder, the coupling device being mounted on a rotation axis of the substrate holder and cantilevered on the supporting frame;
    wherein the at least one process chamber comprises a recession of a size determined by dimensions of the rotatable substrate holder, the recession being sufficient for housing the processing devices and monitoring devices;
    wherein the substrate holder has an open face and a closed face, the open face being oriented towards a working area and having a circumscribed diameter corresponding to a maximal circumscribed diameter of the substrate holder, and wherein the transport system of the in-line coater is adapted to moving the substrate holder synchronously step-by-step from the input load lock chamber to the output load lock chamber in a direction perpendicular to the rotation axis of the substrate holder, and wherein the transport system is adapted to moving the substrate holder to the working area along the rotation axis of the substrate holder in each of the least one process chamber.

2. The in-line coater of claim 1, wherein the supporting frame of the transport system is configured to move in a horizontal position, the rotation axis of the substrate holder being oriented vertically.

3. The in-line coater of claim 1, wherein the supporting frame of the transport system is configured to move in a vertical position, the rotation axis of the substrate holder being oriented horizontally.

4. The in-line coater of claim 1, wherein the at least one process chamber is divided into a working area zone and a moving zone, wherein a diaphragm rigidly mounted on the supporting frame separates the working area zone from the moving zone.

5. The in-line coater of claim 1, wherein the substrate holder is made as a rotational surface, a dome, a truncated cone or a cylinder.

6. The in-line coater of claim 5, wherein the substrate holder is made as a cylinder with through-holes on the forming surface, and wherein the working area comprises at least two processing devices for simultaneous two-sided film deposition on the surfaces of the substrates.

7. The in-line coater of claim 5, wherein the forming surface of the substrate holder has through-holes for mounting the substrates.

8. The in-line coater of claim 1, wherein the forming surface of the substrate holder comprises devices for independent rotation of the substrates.

9. The in-line coater of claim 1, wherein the forming surface of the substrate holder has through-holes for mounting the substrates.

10. The in-line coater of claim 1, wherein the working area of the at least one process chamber has elements providing gas insulation of the processing devices.

11. The in-line coater of claim 1, further comprising fixture serving to fix the substrates on the forming surface of the substrate holder.

12. The in-line coater of claim 11, wherein the fixtures serving to fix the substrates on the forming surface of the substrate holder are removable.

13. The in-line coater of claim 1, wherein the processing devices are evaporators and/or magnetrons and/or ion sources and/or plasma generators.

14. The in-line coater of claim 1, wherein the monitoring devices are optical transmission/reflection control devices and/or quartz coating rate meters.

* * * * *